US012683627B2

(12) United States Patent   (10) Patent No.: US 12,683,627 B2
Javvaji et al.   (45) Date of Patent: Jul. 14, 2026

(54) HIGH-SPEED CONTINUOUS-TIME DELTA-SIGMA MODULATOR INCLUDING AN AMPLIFIER WITH LIMITED GAIN

(71) Applicant: NXP B.V., Eindhoven (NL)

(72) Inventors: Sundeep Lakshmana Javvaji, Delft (NL); Muhammed Bolatkale, Delft (NL); Shagun Bajoria, Eindhoven (NL); Lucien Johannes Breems, Waalre (NL); Kofi Afolabi Anthony Makinwa, Delft (NL)

(73) Assignee: NXP B.V., Eindhoven (NL)

( * ) Notice: Subject to any disclaimer, the term of this patent is extended or adjusted under 35 U.S.C. 154(b) by 100 days.

(21) Appl. No.: 18/824,327

(22) Filed: Sep. 4, 2024

(65) Prior Publication Data

US 2026/0066919 A1  Mar. 5, 2026

(51) Int. Cl.
 *H03M 3/00* (2006.01)
 *H03G 3/00* (2006.01)
(52) U.S. Cl.
 CPC ............ *H03M 3/354* (2013.01); *H03G 3/002* (2013.01); *H03G 3/008* (2013.01); *H03G 2201/103* (2013.01); *H03G 2201/502* (2013.01)
(58) Field of Classification Search
 CPC ....... H03M 3/354; H03G 3/002; H03G 3/008; H03G 2201/103; H03G 2201/502
 See application file for complete search history.

(56) References Cited

U.S. PATENT DOCUMENTS

| 6,087,969 | A * | 7/2000 | Stockstad | ............. | H03M 3/394 |
| | | | | | 341/143 |
| 6,222,705 | B1 * | 4/2001 | Stupp | ....................... | G11B 5/53 |
| | | | | | 360/291.6 |
| 6,271,836 | B1 * | 8/2001 | Makinwa | .............. | G06F 3/0418 |
| | | | | | 345/173 |
| 6,515,812 | B1 * | 2/2003 | Bergmans | ........ | G11B 20/10009 |
| | | | | | 360/48 |
| 6,768,436 | B1 * | 7/2004 | Chuang | ................. | H03M 3/364 |
| | | | | | 341/143 |

(Continued)

OTHER PUBLICATIONS

Boutin, N: "Active compensation of op-amp inverting amplifier using NIC"; Electronics Letters; vol. 17, Issue 25; Dec. 10, 1981; DOI: 10.1049/el:19810682.

(Continued)

*Primary Examiner* — Lam T Mai

(57) ABSTRACT

A modulator circuit may include an integrator circuit and a gain compensation circuit. The integrator circuit may include a first amplifier including an input to receive a signal and an output to provide an inverted signal and a capacitor including a first terminal coupled to the input and a second terminal coupled to the output. The gain compensation circuit may include a second inverter amplifier including a gain input coupled to the output of the first amplifier and including a gain output; a first resistor including a first terminal coupled to the gain output and including a second terminal; and a second capacitor including a first terminal coupled to the second terminal of the first resistor and including a second terminal coupled to the gain input. The integrator circuit has a finite DC gain and the gain compensation circuit is configured to compensate for the finite DC gain.

19 Claims, 7 Drawing Sheets

(56) References Cited

U.S. PATENT DOCUMENTS

| | | | | |
|---|---|---|---|---|
| 6,940,438 | B2* | 9/2005 | Koe | H03M 3/442 |
| | | | | 341/143 |
| 7,411,534 | B1* | 8/2008 | Melanson | H03M 3/332 |
| | | | | 341/131 |
| 7,436,336 | B2 | 10/2008 | Vadipour | |
| 7,535,295 | B1* | 5/2009 | Huijsing | H03F 1/26 |
| | | | | 327/124 |
| 8,120,422 | B1* | 2/2012 | Huijsing | H03F 3/387 |
| | | | | 327/124 |
| 8,179,195 | B1* | 5/2012 | Huijsing | H03F 3/45941 |
| | | | | 330/126 |
| 8,581,763 | B2 | 11/2013 | Niwa et al. | |
| 9,276,792 | B1* | 3/2016 | Makinwa | H03M 3/464 |
| 9,906,384 | B1* | 2/2018 | Rutten | H04L 25/03885 |
| 9,923,572 | B2* | 3/2018 | Bacchu | H03F 3/45475 |
| 10,014,879 | B1* | 7/2018 | Zanbaghi | H03M 1/12 |
| 10,498,214 | B2* | 12/2019 | Gopalraju | H02M 3/158 |
| 10,541,699 | B1* | 1/2020 | Rutten | H03M 3/322 |
| 10,763,888 | B1* | 9/2020 | Zhang | H03M 3/352 |
| 10,812,119 | B1* | 10/2020 | Ciacci | H04B 1/10 |
| 11,038,522 | B1* | 6/2021 | Witte | H03M 1/0641 |
| 11,133,820 | B1* | 9/2021 | Wang | H03M 3/364 |
| 11,290,124 | B2* | 3/2022 | Modaffari | H03M 3/452 |
| 11,394,395 | B1* | 7/2022 | Zhang | H03M 3/424 |
| 11,502,699 | B1* | 11/2022 | Rutten | H03M 3/43 |
| 11,522,557 | B1* | 12/2022 | Rutten | H03M 3/38 |
| 2002/0051497 | A1* | 5/2002 | Breems | H03D 7/165 |
| | | | | 375/261 |
| 2005/0068221 | A1* | 3/2005 | Freeman | H03M 3/46 |
| | | | | 341/161 |
| 2006/0017595 | A1* | 1/2006 | Van Veldhoven | H03M 3/348 |
| | | | | 341/143 |
| 2006/0141786 | A1* | 6/2006 | Boezen | G01P 15/0802 |
| | | | | 438/689 |
| 2007/0035423 | A1* | 2/2007 | Breems | H03M 1/1004 |
| | | | | 341/120 |
| 2007/0229331 | A1* | 10/2007 | Pertijs | H03M 3/3287 |
| | | | | 341/120 |
| 2008/0062026 | A1* | 3/2008 | Melanson | H03M 3/412 |
| | | | | 341/155 |
| 2008/0094268 | A1* | 4/2008 | Pelgrom | H03M 3/418 |
| | | | | 341/155 |
| 2008/0218392 | A1* | 9/2008 | Van Veldhoven | H03M 3/462 |
| | | | | 455/334 |
| 2008/0272944 | A1* | 11/2008 | Zhou | H03M 3/352 |
| | | | | 341/143 |
| 2008/0298507 | A1* | 12/2008 | Breems | H03D 3/007 |
| | | | | 375/320 |
| 2009/0002211 | A1* | 1/2009 | Breems | H03M 3/354 |
| | | | | 341/143 |
| 2009/0212875 | A1* | 8/2009 | Makinwa | H03L 7/00 |
| | | | | 331/34 |
| 2010/0201551 | A1* | 8/2010 | Sebastiano | H03F 1/304 |
| | | | | 341/120 |
| 2010/0216523 | A1* | 8/2010 | Sebastiano | H04W 52/0229 |
| | | | | 455/574 |
| 2011/0050283 | A1* | 3/2011 | Makinwa | H03L 7/091 |
| | | | | 327/7 |
| 2011/0122005 | A1* | 5/2011 | Hekstra | H03M 3/386 |
| | | | | 341/118 |
| 2011/0148678 | A1* | 6/2011 | Hu | H03M 1/0668 |
| | | | | 341/150 |
| 2011/0182389 | A1* | 7/2011 | Breems | H03M 1/0836 |
| | | | | 375/346 |
| 2011/0187428 | A1* | 8/2011 | Kashmiri | H03L 7/08 |
| | | | | 327/159 |
| 2011/0199247 | A1* | 8/2011 | van Veldhoven | H03M 3/368 |
| | | | | 341/143 |
| 2011/0200070 | A1* | 8/2011 | Makinwa | H03M 1/14 |
| | | | | 374/170 |
| 2011/0254718 | A1 | 10/2011 | Matsukawa et al. | |
| 2012/0139587 | A1* | 6/2012 | Drago | H03L 7/0802 |
| | | | | 327/106 |
| 2012/0326904 | A1* | 12/2012 | Jensen | H03M 3/396 |
| | | | | 341/131 |
| 2013/0147528 | A1* | 6/2013 | Makinwa | H03L 7/02 |
| | | | | 327/141 |
| 2013/0154718 | A1* | 6/2013 | Huijsing | H03K 17/08104 |
| | | | | 327/434 |
| 2013/0214952 | A1* | 8/2013 | Makinwa | H03M 3/414 |
| | | | | 341/143 |
| 2014/0232456 | A1* | 8/2014 | Huijsing | H03F 1/14 |
| | | | | 330/9 |
| 2014/0333462 | A1* | 11/2014 | Breems | H03M 3/39 |
| | | | | 341/143 |
| 2015/0171888 | A1* | 6/2015 | Breems | H03M 3/45 |
| | | | | 341/143 |
| 2015/0200628 | A1* | 7/2015 | Rutten | H03D 7/1466 |
| | | | | 455/326 |
| 2015/0381119 | A1* | 12/2015 | Lu | H03F 3/2173 |
| | | | | 330/251 |
| 2016/0036460 | A1 | 2/2016 | Mattisson et al. | |
| 2016/0056835 | A1* | 2/2016 | Hung | H03M 3/354 |
| | | | | 341/143 |
| 2016/0065231 | A1* | 3/2016 | Gonen | H03M 1/42 |
| | | | | 341/156 |
| 2016/0109396 | A1* | 4/2016 | Cai | G01N 25/18 |
| | | | | 702/136 |
| 2016/0173120 | A1* | 6/2016 | Doare | H03M 3/378 |
| | | | | 341/120 |
| 2017/0019124 | A1* | 1/2017 | Breems | H03M 3/50 |
| 2017/0074912 | A1* | 3/2017 | Draxelmayr | G01R 1/20 |
| 2017/0149388 | A1* | 5/2017 | Bajoria | H03F 3/45183 |
| 2017/0150521 | A1* | 5/2017 | Niehof | H03M 1/08 |
| 2017/0317860 | A1* | 11/2017 | Bolatkale | H03M 1/1009 |
| 2018/0183459 | A1* | 6/2018 | Breems | H03M 3/412 |
| 2018/0217009 | A1* | 8/2018 | Yousefzadeh | G01K 15/005 |
| 2018/0241409 | A1* | 8/2018 | Dagher | H03M 3/396 |
| 2018/0340767 | A1* | 11/2018 | Nihtianov | G01B 7/20 |
| 2018/0343013 | A1* | 11/2018 | Breems | H03M 3/496 |
| 2019/0072597 | A1* | 3/2019 | Walsh | G06F 3/041661 |
| 2019/0215034 | A1* | 7/2019 | Breems | H04B 1/40 |
| 2019/0245553 | A1* | 8/2019 | Bolatkale | H03M 3/424 |
| 2020/0373923 | A1* | 11/2020 | Walsh | G01R 27/2611 |
| 2020/0412345 | A1* | 12/2020 | Bajoria | H03F 3/45264 |
| 2021/0126648 | A1* | 4/2021 | Zhang | H03M 1/1061 |
| 2021/0408281 | A1* | 12/2021 | Javvaji | H10D 30/832 |
| 2021/0409010 | A1* | 12/2021 | Javvaji | H03K 19/018521 |
| 2022/0026543 | A1* | 1/2022 | Bolatkale | G01S 7/4863 |
| 2022/0077829 | A1* | 3/2022 | Rooijers | H03F 3/68 |
| 2022/0091239 | A1* | 3/2022 | Bolatkale | G01S 7/487 |
| 2022/0239314 | A1* | 7/2022 | Zhang | H03M 3/44 |
| 2022/0244322 | A1* | 8/2022 | Motz | G01R 33/07 |
| 2022/0390977 | A1* | 12/2022 | Chauhan | G05F 3/262 |
| 2022/0416809 | A1* | 12/2022 | Zhang | H03M 3/34 |
| 2023/0017344 | A1* | 1/2023 | Bolatkale | H03M 3/344 |
| 2023/0102232 | A1* | 3/2023 | Breems | H03M 3/34 |
| | | | | 341/143 |
| 2023/0208435 | A1* | 6/2023 | Makinwa | H03M 3/322 |
| | | | | 341/143 |
| 2023/0238974 | A1* | 7/2023 | Rutten | H03M 1/0621 |
| | | | | 341/118 |
| 2023/0314176 | A1* | 10/2023 | Motz | G01D 5/145 |
| | | | | 324/207.2 |
| 2023/0361781 | A1* | 11/2023 | Bolatkale | H03M 1/0673 |
| 2023/0370031 | A1* | 11/2023 | Javvaji | H03F 3/45179 |
| 2023/0412180 | A1* | 12/2023 | Liu | H03M 1/502 |
| 2024/0048146 | A1* | 2/2024 | Bajoria | H03M 1/662 |
| 2024/0048150 | A1* | 2/2024 | Breems | H03M 3/354 |
| 2024/0063812 | A1* | 2/2024 | Abdelaal | H03M 3/422 |
| 2024/0072821 | A1* | 2/2024 | Perrott | H03M 1/802 |
| 2024/0255975 | A1* | 8/2024 | Makinwa | G05F 3/30 |
| 2024/0275365 | A1* | 8/2024 | Hardeman | H03H 17/0621 |
| 2025/0300634 | A1* | 9/2025 | Hardeman | H03H 17/0294 |
| 2025/0330189 | A1* | 10/2025 | Gao | H03M 1/1014 |

(56)            References Cited

OTHER PUBLICATIONS

Cho, Young-Kyun et al.; "A Low-Power Continuous-Time Delta-Sigma Modulator Using a Resonant Single Op-Amp Third-Order Loop Filter"; IEEE Transactions on Circuits and Systems II: Express Briefs; vol. 65, No. 7, Jul. 2018; Date of Publication: Jul. 20, 2017; DOI: 10.1109/TCSII.2017.2729595.

Jang, MoonHyung et al.; "Analysis and Design of Low-Power Continuous-Time Delta-Sigma Modulator Using Negative-R Assisted Integrator"; IEEE Journal of Solid-State Circuits; vol. 54, No. 1, Jan. 2019).

Laber, Carlos A. et al.; "A Positive-Feedback Transconductance Amplifier with Applications to High-Frequency, High-Q CMOS Switched-Capacitor Filters"; IEEE Journal of Solid-State Circuits; vol. 23, No. 6, Dec. 1988.

Andersson Mattias et al: "Theory and design of a CT \Updelta\UpsigmaΔΣ modulator with low sensitivity to loop-delay variations"; Analog Integrated Circuits and Signal Processing, vol. 76, No. 3, Sep. 2013, pp. 353-366; DOI:10.1007/s10470-013-0114-y.

Matsukawa, Kazuo et al.; "A Fifth-Order Continuous-Time Delta-Sigma Modulator With Single-Opamp Resonator"; IEEE Journal of Solid-State Circuits ( vol. 45, Issue: 4, Apr. 2010), pp. 697-706; Date of Publication Mar. 22, 2010; DOI: 10.1109/JSSC.2010.2042244.

* cited by examiner $$TF_{INT} = \frac{A}{1+ASC_{222}R_{204}}$$

$$TF_{GAIN} = \frac{1 + ASC_{222}R_{204}}{ASC_{222}R_{204}}$$

$$TF_{TARGET} = \frac{1}{SC_{222}R_{204}}$$

700

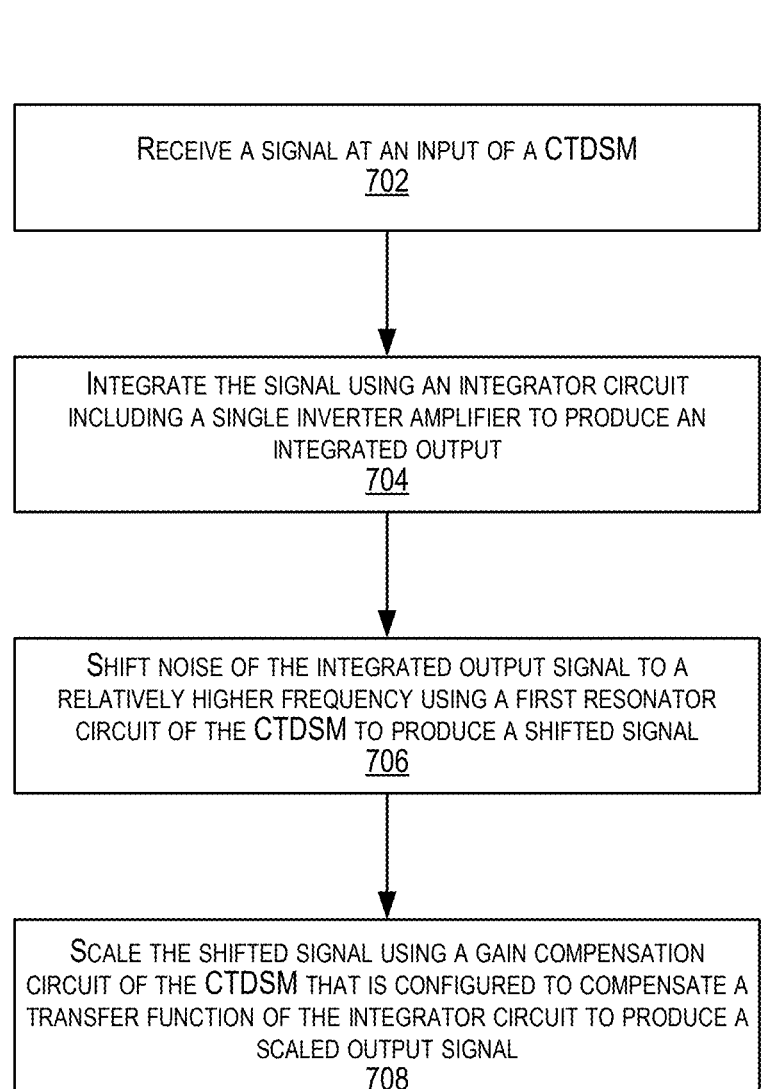

RECEIVE A SIGNAL AT AN INPUT OF A CTDSM
702

INTEGRATE THE SIGNAL USING AN INTEGRATOR CIRCUIT
INCLUDING A SINGLE INVERTER AMPLIFIER TO PRODUCE AN
INTEGRATED OUTPUT
704

SHIFT NOISE OF THE INTEGRATED OUTPUT SIGNAL TO A
RELATIVELY HIGHER FREQUENCY USING A FIRST RESONATOR
CIRCUIT OF THE CTDSM TO PRODUCE A SHIFTED SIGNAL
706

SCALE THE SHIFTED SIGNAL USING A GAIN COMPENSATION
CIRCUIT OF THE CTDSM THAT IS CONFIGURED TO COMPENSATE A
TRANSFER FUNCTION OF THE INTEGRATOR CIRCUIT TO PRODUCE A
SCALED OUTPUT SIGNAL
708

*FIG. 7*

HIGH-SPEED CONTINUOUS-TIME DELTA-SIGMA MODULATOR INCLUDING AN AMPLIFIER WITH LIMITED GAIN

FIELD OF USE

The present disclosure generally relates to delta-sigma modulators, and more particularly to continuous-time delta sigma modulators with a first amplifier limited gain and with gain compensation.

BACKGROUND

Continuous-time delta-sigma ($\Delta\Sigma$) modulators (CTDSM) are well-suited for achieving ultra-high linearity ($<-100$ decibels relative to the carrier signal (dBc)) over wide bandwidths ($\geq 100$ megahertz (MHz)) demanded by broad-band amplitude modulated and frequency modulated (AM/FM) radio and emerging radar applications. Linearity of a CTDSM is often limited by the linearity of the first integrator used in its loop filter. CTDSMs may also require a relatively high DC gain to suppress quantization noise sufficiently in low over-sampling ratio (OSR) designs. Often, the overall power of the loop filter is limited by the power dissipated in the first integrator to achieve high linearity and high gain while sinking/sourcing the large digital-to-analog converter (DAC) switching currents at gigahertz (GHz) sampling frequencies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures and in the detailed description indicates similar or identical items or features.

FIG. 7 depicts a flow diagram of a method of modulating a received signal, in accordance with certain embodiments.

While implementations are described in this disclosure by way of example, those skilled in the art will recognize that the implementations are not limited to the examples or figures described. Rather, the figures and detailed description thereto are not intended to limit implementations to the form disclosed, but instead the intention is to cover all modifications, equivalents, and alternatives falling within the spirit and scope as defined by the appended claims. The headings used in this disclosure are for organizational purposes only and are not meant to limit the scope of the description or the claims. As used throughout this application, the word "may" is used in a permissive sense (in other words, the term "may" is intended to mean "having the potential to") instead of in a mandatory sense (as in "must"). Similarly, the terms "include," "including," and "includes" mean "including, but not limited to."

DETAILED DESCRIPTION

Continuous-time delta-sigma modulators (CTDSMs) are widely used to achieve the high linearity requirements ($<-100$ dBFS) intended for high quality radio and car radar applications. To realize bandwidths of a few tens of megahertz (MHz) to hundreds of MHz, such CTDSMs may require sampling frequencies in gigahertz. Multi-stage inverter-based amplifiers are often used to realize high gain-bandwidths for the integrators used in loop filters. Linearity of a CTDSM may be limited by the linearity of the first integrator used in its loop filter. The CTDSM may also require high direct current (DC) gain to suppress quantization noise sufficiently in low over-sampling ratio (OSR) designs. Often, the overall power of the loop filter is limited by the power dissipated by the first integrator to achieve high linearity, and high gain while sinking/sourcing the large DAC switching currents at GHz sampling frequencies. Multi-stage inverter-based amplifiers can achieve tens of GHz unity gain frequencies. An example of a multi-stage inverter is described below with respect to FIG. 1A.

Figure 1A:
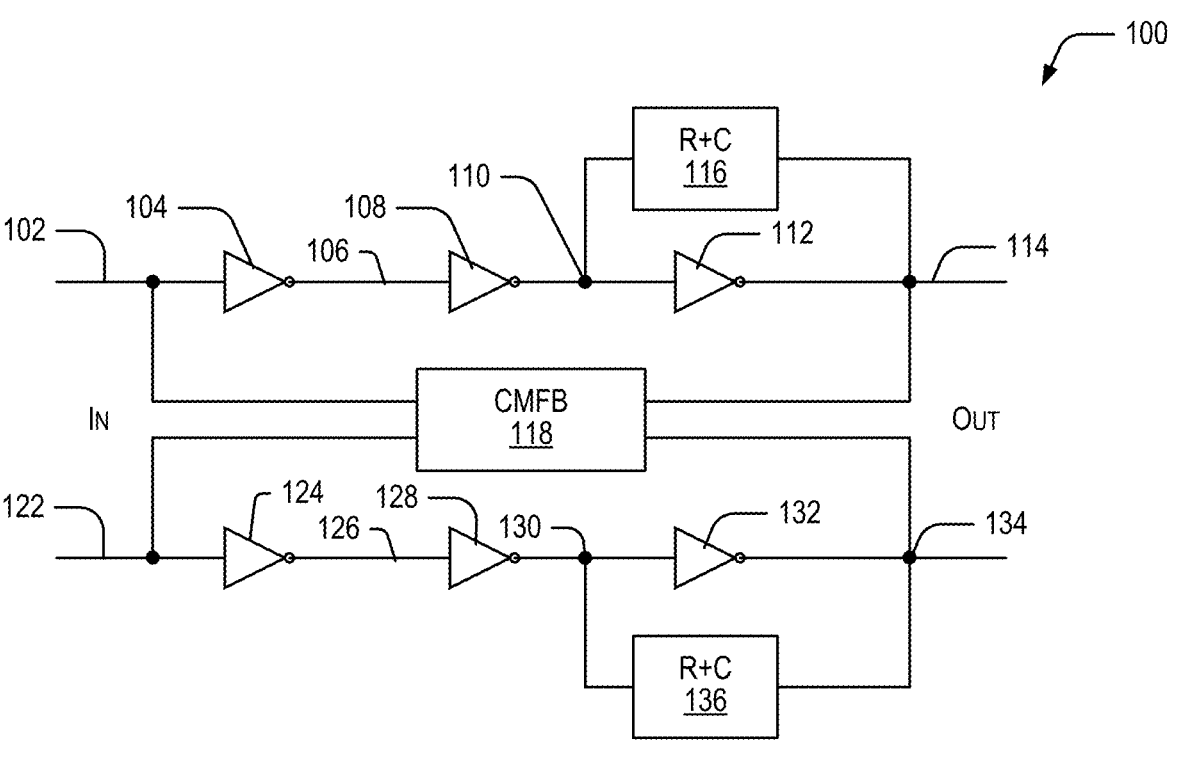
FIG. 1A depicts a three-stage inverter-based amplifier with common mode feedback.

FIG. 1A depicts a three-stage inverter-based amplifier 100 with common mode feedback. The amplifier 100 may include an input including a node 102 and a node 122 to receive a signal and an output including a node 114 and a node 134 to provide an output signal. The amplifier 100 may include a first signal path including amplifiers 104, 108, and 112 coupled in series between the nodes 102 and 114 and a second signal path including amplifiers 124, 128, and 132 coupled in series between the nodes 122 and 134. The amplifier 100 may include a common mode feedback loop 118 that is coupled to the nodes 102, 114, 122, and 134 to provide common mode feedback for both signal paths.

The inverter 104 may include an input coupled to the node 102 and an output coupled to a node 106. The inverter 108 may include an input coupled to the node 106 and an output coupled to the node 110. The amplifier 112 may include an input coupled to the node 110 and an output coupled to the node 114. The amplifier 112 may be coupled to a feedback loop including a resistor-capacitor circuit 116 coupled between the nodes 110 and 114 to provide frequency compensation to stabilize the amplifier 100.

The inverter 124 may include an input coupled to the node 122 and an output coupled to a node 126. The inverter 128 may include an input coupled to the node 126 and an output coupled to a node 130. The inverter 132 may include an input coupled to the node 130 and an output coupled to the node 134. The amplifier 132 may be coupled to a feedback loop including a resistor-capacitor circuit 136 coupled between the nodes 130 and 134 to provide frequency compensation to stabilize the amplifier 100.

In this configuration, the inverters 104 and 124 may dominate the overall input-referred thermal noise, while the inverters 112 and 132 may dominate the non-linearity of the amplifier 100. Bias currents to the inverters 104, 112, 124, and 132 are relatively high to achieve low noise and high linearity. Further, the resistor-capacitor circuits 116 and 136 that provide frequency compensation to stabilize the amplifier 100 may make the amplifier 100 slower and may increase power consumption of the amplifier 100 for the same unity gain frequency.

Embodiments of devices, circuits, and methods are described below that utilize a single-stage inverter-based amplifier, which may reduce overall power consumption. In one or more embodiments, the single-stage inverter-based amplifier may reuse the same bias current to achieve both high linearity and low noise. While the single-stage inverter-based amplifier may have a relatively low gain, which may limit the quantization noise suppression, the amplifier may include gain compensation without increasing the overall power consumption relative to the multi-stage inverter-based amplifier 100. An example of a single-stage inverter-based amplifier is described below with respect to FIG. 1B.

Figure 1B:
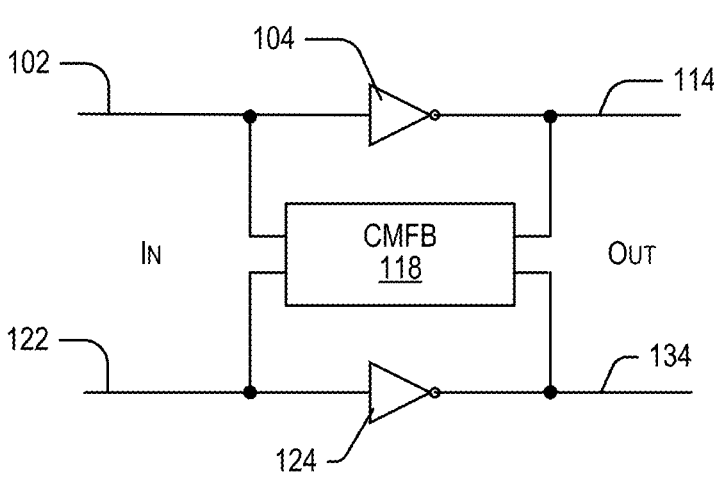
FIG. 1B depicts a single-stage inverter-based amplifier with common mode feedback, in accordance with certain embodiments.

FIG. 1B depicts a single-stage inverter-based amplifier 140 with common mode feedback 118, in accordance with certain embodiments. The amplifier 140 may include an input including a node 102 and a node 122 to receive a signal and an output including a node 114 and a node 134 to provide an output signal. The amplifier 140 may include a first signal path including an amplifier 104 coupled between the nodes 102 and 114 and a second signal path including amplifier 124 coupled between the nodes 122 and 134. The amplifier 140 may include a common mode feedback loop 118 that is coupled to the nodes 102, 114, 122, and 134 to provide common mode feedback for both signal paths.

Unlike the amplifier 100 in FIG. 1A, the amplifier 140 does not include the resistor-capacitor circuits 116 and 136 to provide frequency compensation for stabilization. In the illustrated embodiment, the same bias current may determine both noise and linearity. Increasing this bias current may improve both the linearity and thermal noise performance of the amplifier 140, significantly improving its efficiency. Moreover, since the amplifier 140 includes only one stage, there is no need for frequency compensation, enhancing the overall speed of the amplifier 140 relative to the amplifier 100 in FIG. 1A.

The single-stage inverter-based amplifier 140 has a limited direct current (DC) gain, which may limit quantization-noise suppression in in-band frequencies, especially in low over-sampling ratio (OSR) designs (e.g., OSR<25). The limited DC gain and limited quantization-noise suppression may limit the signal-to-quantization-noise (SQNR) ratio, which reflects the relationship between a maximum nominal signal strength and the quantization error (noise) introduced in the analog-to-digital conversion. In one or more embodiments, the single-stage inverter-based amplifier 140 may be modified to include a gain compensation circuit configured to improve the SQNR. An example of an amplifier including the single-stage inverter-based amplifier 140 and a gain compensation circuit is described below with respect to FIG. 2.

Figure 2:
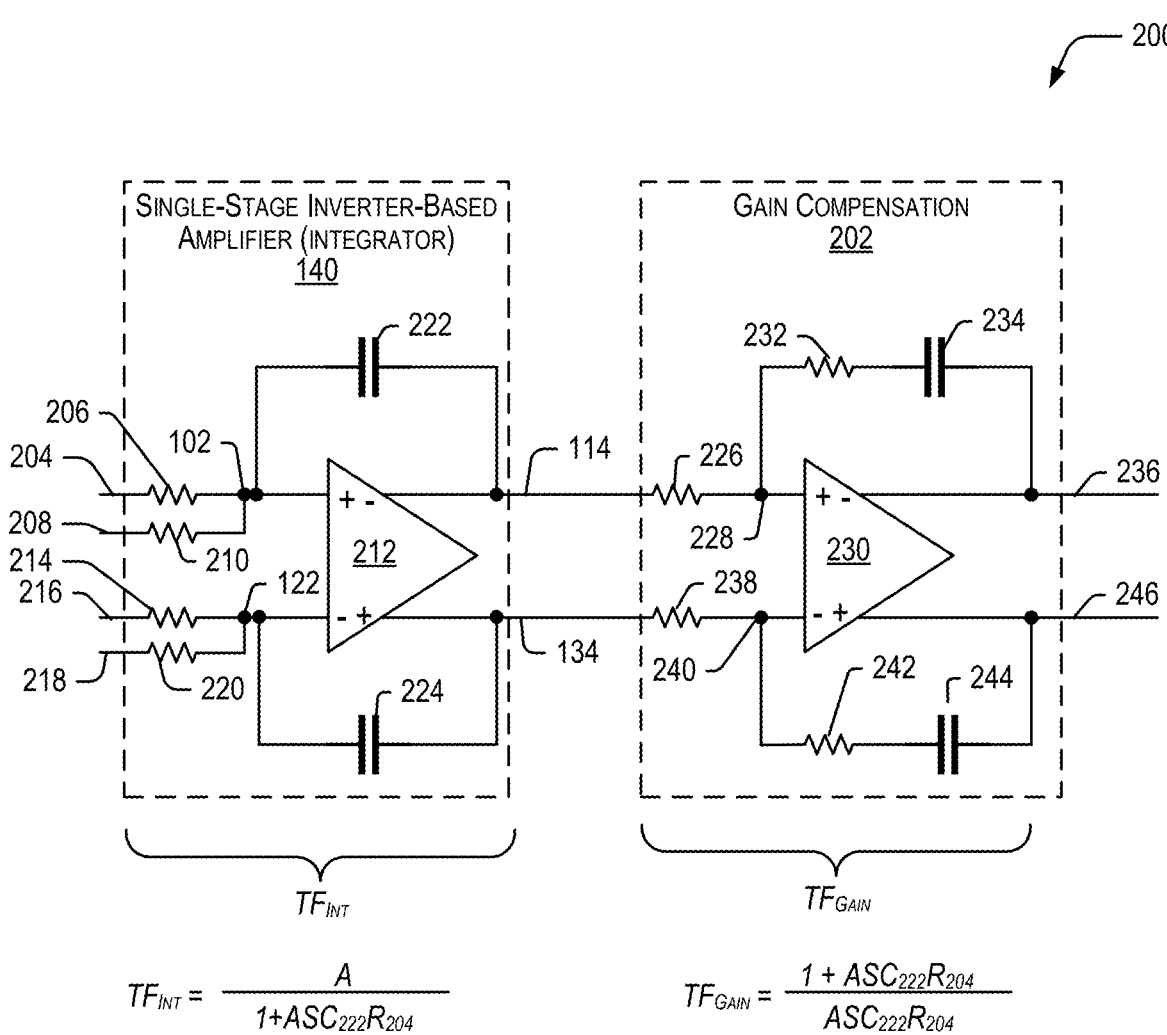
FIG. 2 depicts an embodiment of a circuit to provide gain compensation, in accordance with certain embodiments.

FIG. 2 depicts an embodiment of a circuit 200 to provide gain compensation, in accordance with certain embodiments. The circuit 200 may include a single-stage inverter-based amplifier 140 coupled in series with a gain compensation circuit 202, which may be configured to compensate for the low DC gain of the single-stage inverter-based amplifier 140 to provide an improved SQNR.

The single-stage inverter-based amplifier 140 may include an input including the nodes 102 and 122 and an output including the nodes 114 and 134. The amplifier 140 may include a first input 204 to receive a signal and that is coupled to the node 102 through a resistor 206. The amplifier

140 may include a second input 208 coupled to the node 102 through a resistor 210. The second input 208 and the resistor 210 may represent feedback received from a digital-to-analog converter (DAC) associated with a feedback loop. The amplifier 140 may include a third input 216 to receive a signal and that is coupled to the node 122 through a resistor 214. The amplifier 140 may include a fourth input 218 coupled to the node 122 through a resistor 220. The fourth input 218 and the resistor 220 may represent feedback received from the DAC associated with the feedback loop. The amplifier 140 may include an inverting amplifier 212 including a positive input coupled to the node 102, a negative input coupled to the node 122, a negative output coupled to the node 114, and a positive output coupled to the node 134. The amplifier 140 may include a capacitor 222 coupled between the nodes 102 and 114 and may include a capacitor 224 coupled between the nodes 122 and 134.

The gain compensation circuit 202 may include a resistor 226 coupled between the node 114 and a node 228 and may include a resistor 238 coupled between the node 134 and a node 240. The gain compensation circuit 202 may include an inverting amplifier 230 including a positive input coupled to the node 228, a negative input coupled to the node 240, a negative output coupled to a node 236, and a positive output coupled to a node 246. The gain compensation circuit 202 may include a resistor 232 and a capacitor 234 coupled in series between the nodes 228 and 236 and may include a resistor 242 and a capacitor 244 coupled in series between the nodes 240 and 246.

In the illustrated embodiment, the single-stage inverter-based amplifier 140 is implemented an integrator. The transfer function TF of the amplifier 140 may be determined as follows:

$$TF_{Amplifier\,140} = \frac{A}{1 + ASC_{222}R_{206}} \tag{1}$$

where A represents the DC gain of the amplifier 140, $C_{222}$ represents the capacitance of the capacitor 222, $R_{206}$ represents the input resistance of the resistor 206, and S is a variable for the Laplace transformation (i.e., $S=j\omega$ in the context of a Fourier Transform). The ideal transfer function may be determined as follows:

$$TF_{Ideal} = \frac{1}{SC_{222}R_{206}}. \tag{2}$$

Accordingly, the gain compensation circuit 202 may be designed to compensate the transfer function of the amplifier 140 to produce the ideal transfer function. Thus, the gain compensation circuit 202 may be designed to provide the following transfer function:

$$TF_{202} = \frac{1 + ASC_{222}R_{206}}{ASC_{222}R_{206}}$$

In one or more embodiments, the resistors 226 and 232 may be selected to have a resistance that is a product of the gain A and the resistance $R_{206}$ of the resistor 206 (i.e., $R_{226}=R_{232}=A*R_{206}$). The noise and distortion produced by the gain compensation circuit 202 may be suppressed by the gain of the amplifier 140, allowing the gain compensation circuit 202 to be realized with lower power consumption.

Figure 3:
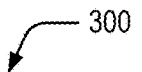
FIG. 3 depicts a graph of the frequency response of the first integrator with gain compensation, in accordance with certain embodiments.
Figure 3:
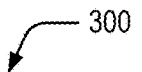

FIG. 3 depicts a graph 300 of the frequency response of the first integrator with gain compensation, in accordance with certain embodiments. The graph 300 may represent the frequency response of one or more embodiments of the circuit 200 of FIG. 2). With a single-stage inverter-based amplifier 140 without gain compensation, the DC gain is about 20-25 dB. Adding the gain compensation circuit 202 as in FIG. 2, the frequency response approaches that of the ideal frequency response. Since one of the notches of the noise transfer function (NTF) may be realized at DC, the additional gain compensation circuit 202 may add more than 30 dB of suppression around DC.

While the gain compensation circuit 202 is shown as being connected directly to the output of the amplifier 140, to further reduce the noise and to further reduce power consumption, the gain compensation circuit 202 can be moved further away from the first integrator in the signal chain. An example of a circuit is described below with respect to FIG. 4 that includes an embodiment of the amplifier 140 and an embodiment of the gain compensation circuit 202 and that is configured to provide a fifth-order loop filter implementation with gain compensation.

Figure 4:
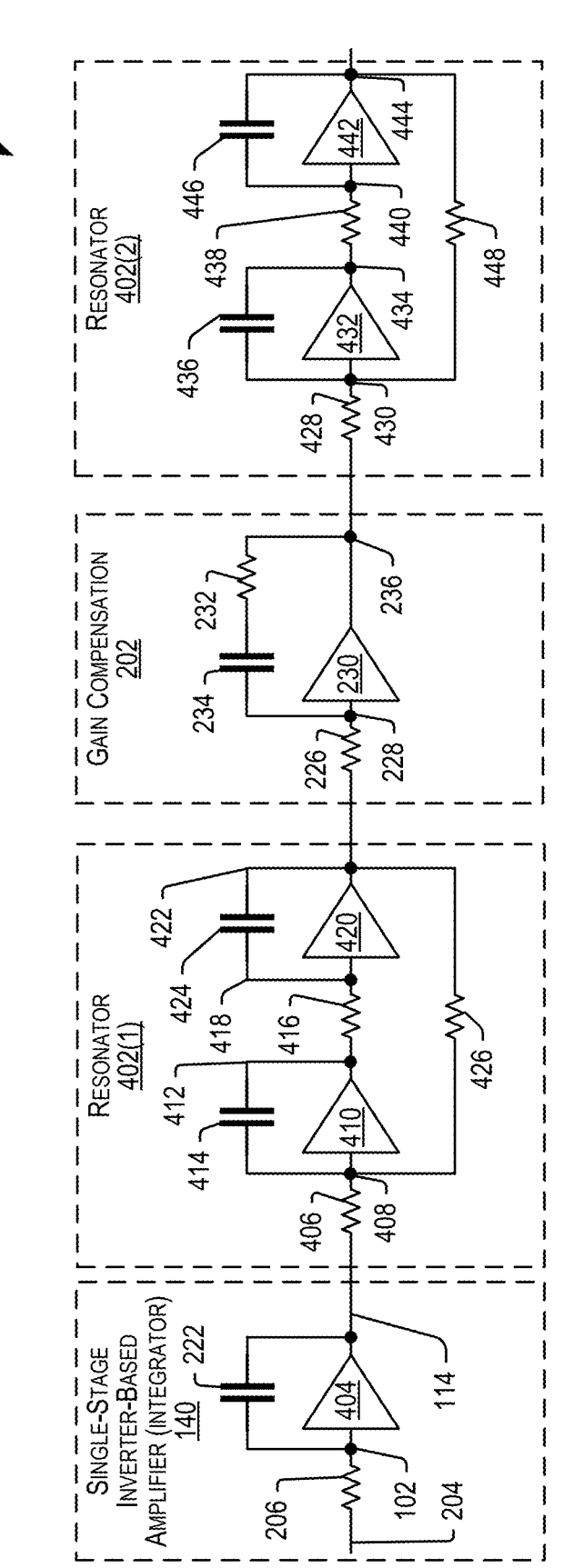
FIG. 4 depicts a circuit diagram of fifth order loop filter implementation with a single-stage inverter-based amplifier and gain compensation, in accordance with certain embodiments.

FIG. 4 depicts a diagram of a circuit 400 configured to provide of fifth order loop filter implementation with a single-stage inverter-based amplifier 140 and a gain compensation circuit 202, in accordance with certain embodiments. In this example, the single-stage inverter-based amplifier 140 is implemented as an integrator. The circuit 400 may include multiple stages including an integrator stage (single-stage inverter-based amplifier 140), a first resonator 402(1) (first resonator stage), a gain compensation circuit 202 (gain compensation stage), and a second resonator 402(2) (second resonator stage).

The amplifier (integrator) 140 may include the input 204 coupled to the node 102 by the resistor 206. The amplifier 140 may include an amplifier circuit 404 including an input coupled to the node 102 and an output coupled to the node 114. The capacitor 222 may be coupled between the nodes 102 and 114. The amplifier circuit 404 and the capacitor 222 form the integrator.

The circuit 400 may include the first resonator 402(1) including an input coupled to the node 114 and an output coupled to a node 422. The first resonator 402(1) may include a resistor 406 coupled between the node 114 and a node 408. The first resonator 402(1) may include an amplifier circuit 410 including an input coupled to the node 408 and an output coupled to a node 412 and may include a capacitor 414 coupled between the nodes 408 and 412. The first resonator 402(1) may include a resistor 416 coupled between the node 412 and a node 418. The first resonator 402(1) may include an amplifier circuit 420 including an input coupled to the node 418 and an output coupled to a node 422 and may include a capacitor 424 coupled between the nodes 418 and 422. The first resonator 402(1) may include a resistor 426 coupled between the nodes 408 and 422.

The gain compensation circuit 202 may include the resistor 226 coupled between the node 422 and the node 228. The gain compensation circuit 202 may include an amplifier circuit 230 including an input coupled to the node 228 and an output coupled to the node 236. The gain compensation circuit 202 may include a resistor 232 and a capacitor 234 in series between the node 228 and the node 236.

The second resonator 402(2) may include a resistor 428 coupled between the node 236 and a node 430. The second resonator 402(2) may include an amplifier circuit 432 including an input coupled to the node 430 and an output coupled to a node 434 and may include a capacitor 436 coupled between the nodes 430 and 434. The second resonator 402(2) may include a resistor 438 coupled between the node 434 and a node 440. The second resonator 402(2) may include an amplifier circuit 442 including an input coupled to the node 440 and an output coupled to a node 444 and may include a capacitor 446 coupled between the nodes 440 and 444. The second resonator 402(2) may include a resistor 448 coupled between the nodes 444 and 430.

To further reduce the noise and power consumption as compared to the embodiment of the circuit 200 of FIG. 2, the gain compensation stage (gain compensation circuit 202) can be moved further in the signal chain as shown by including one or more circuits between the single-stage inverter-based amplifier (integrator) 140 and the gain compensation circuit 202. This separation allows noise and distortion from the gain compensation circuit 202 may be suppressed by gains from one or more preceding stages (such as the first resonator 402(1)). Additionally, by moving the gain compensation circuit 202 to a later stage, any additional delay added by the gain compensating circuit 202 does not impact the first and second order paths of the CTDSM and can be implemented using a multi-stage inverter-based configuration, such as the three-stage configuration shown in FIG. 1A. The capacitor 234 used in the gain compensation circuit 202 may be tuned together with the capacitance $C_{222}$ of the first integrating capacitor 222 to minimize the process variation.

In the illustrated embodiment, the gain compensation circuit 202 is moved after the first resonator 402(1). Since there is no additional gain in the first-order and second-order paths, the feed-forward coefficients of the CTDSM may be tuned to restore the desired noise transfer function, as shown with respect to Equations 2 and 3 above.

Figure 5:
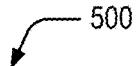
FIG. 5 depicts a graph of the output spectrum of an example of a fifth-order modulator with and without gain compensation, in accordance with certain embodiments.
Figure 5:
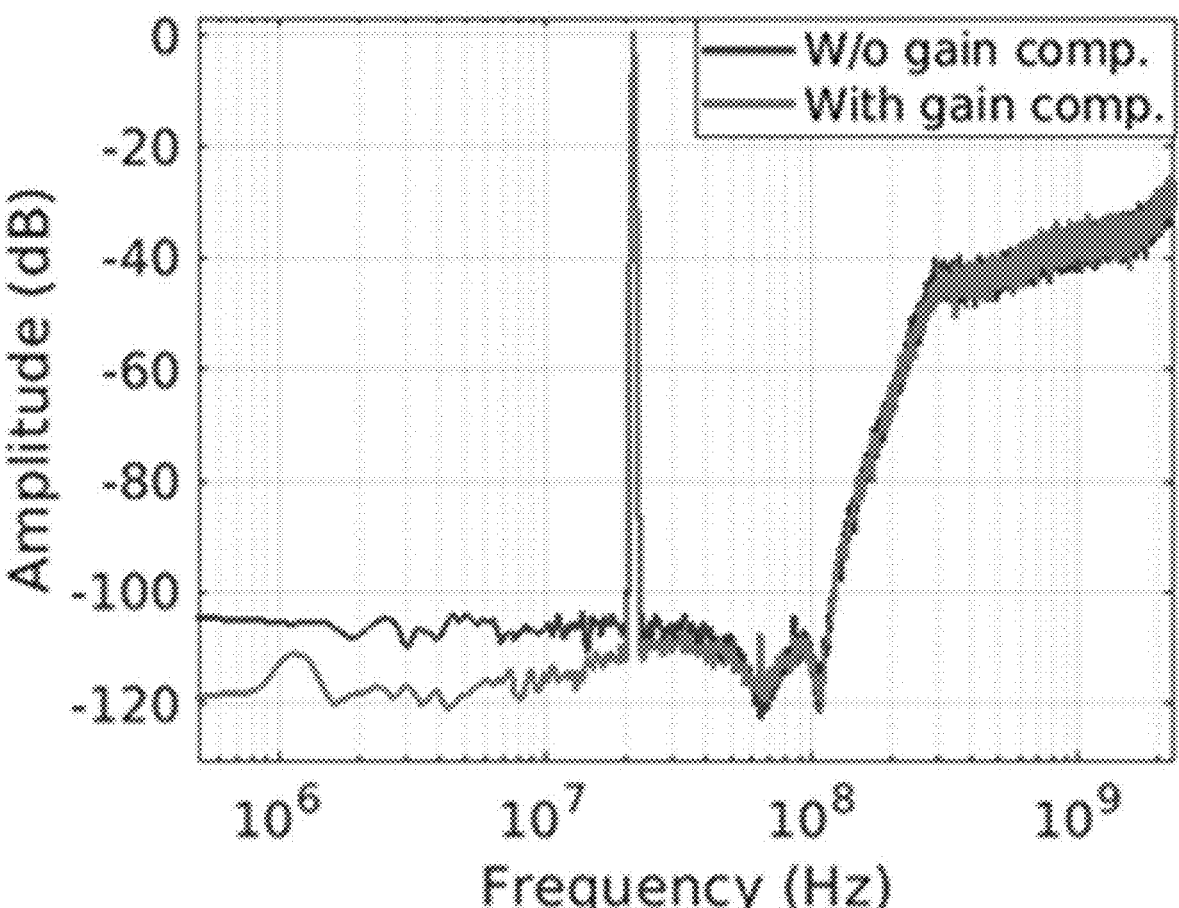

FIG. 5 depicts a graph 500 of the output spectrum of a fifth order CTSDM with and without gain compensation, in accordance with certain embodiments. In this example, a CTSDM may be designed with a bandwidth of 120 MHz and an over-sampling ratio (OSR) of 18. As shown, without gain compensation, quantization noise suppression around DC is limited. When the gain compensation circuit 202 is included further in the signal chain, the overall SQNR in 120 MHz bandwidth is improved by 2.5 dB, which is significant in low OSR designs. By including the gain compensation circuit 202 at a stage of the CTDSM that is after one of the resonators 402, the distortion components around DC are also improved. In the embodiment shown in FIG. 4, the power consumed by the gain compensation circuit 202 may be less than ten percent (10%) of the power consumed by the single-stage inverter-based amplifier (integrator) 140.

Figure 6:
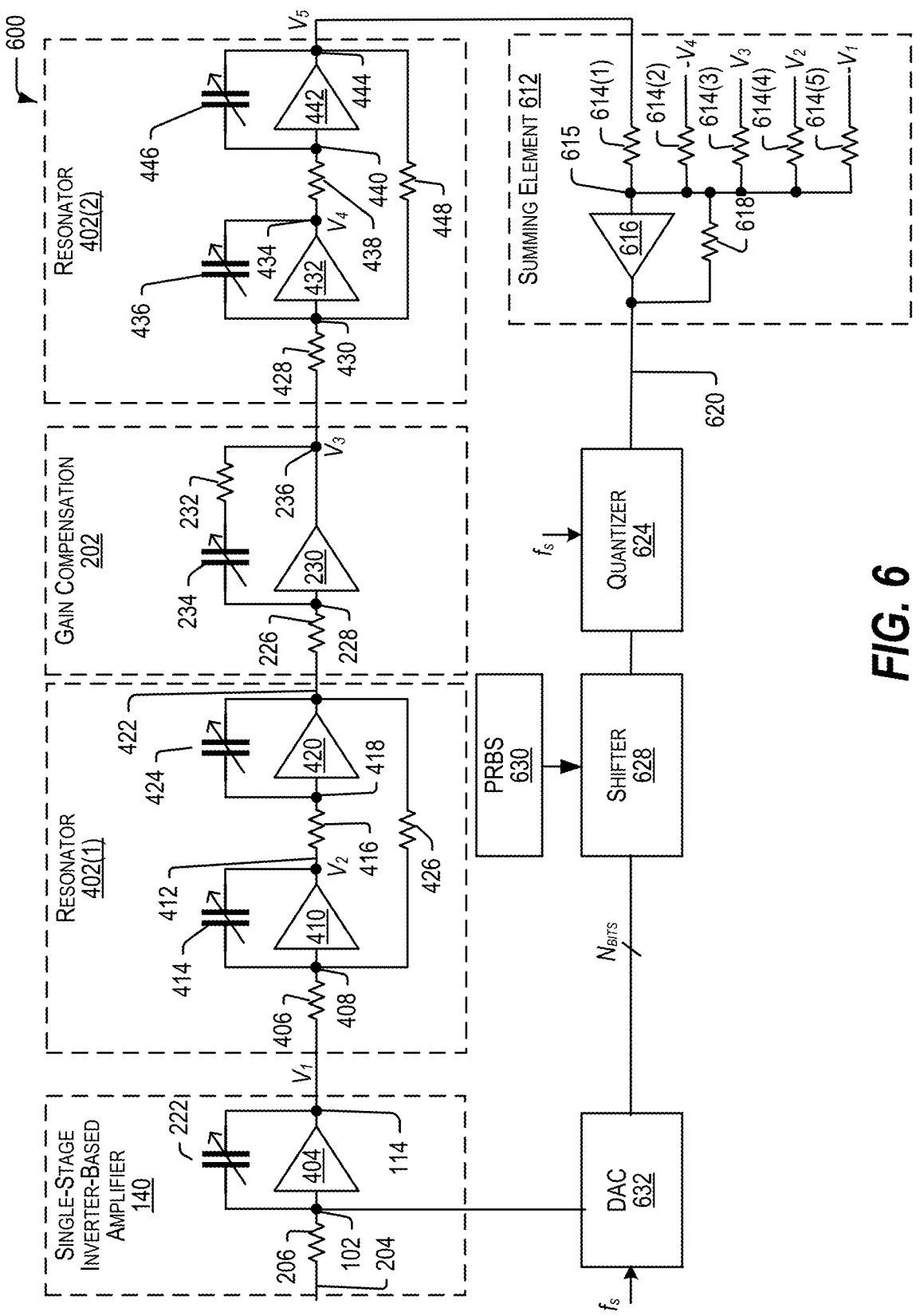
FIG. 6 depicts an embodiment of a wideband CTSDM including a fifth order loop filter that uses a cascaded-integrated-feedforward (CIFF) architecture with a cascade of an integrator, two resonators, and gain compensator, in accordance with certain embodiments.

FIG. 6 depicts an embodiment of a wideband CTSDM 600 including a fifth order loop filter that uses a cascaded-integrated-feedforward (CIFF) architecture with a cascade of an integrator (single-stage inverter-based amplifier 140), two resonators 402(1) and 402(2), and a gain compensation circuit 202, in accordance with certain embodiments. The CTSDM 600 may include all the elements of the circuit 400 of FIG. 4.

In the illustrated embodiment, the amplifier (integrator) 140 includes all the elements of the amplifier 140 in FIG. 4 and includes a capacitor 602 including a first terminal to receive a signal and a second terminal coupled to the node 102 at the input of the amplifier circuit 404. The capacitor 222 is depicted as a variable capacitor, which may be implemented using a capacitor bank including a fixed capacitor and a number of capacitors that may be selectively connected in parallel with the fixed capacitor. The number of capacitors may vary based on a desired variation in the capacitance. In one or more embodiments, the capacitor bank may be a six-bit programmable capacitor bank.

The first resonator 402(1) includes all the elements of the first resonator 402(1) in FIG. 4 and includes capacitors 604 and 606. The capacitor 604 may include a first terminal to receive a signal and includes a second terminal coupled to the node 408. The capacitor 606 includes a first terminal to receive a signal and a second terminal coupled to the node 418. The capacitors 414 and 424 are depicted as variable capacitors, each of which may be implemented using a capacitor bank including a fixed capacitor and a number of capacitors that may be selectively connected in parallel with the fixed capacitor. The number of capacitors may vary based on a desired variation in the capacitance. In one or more embodiments, the capacitor banks may be six-bit programmable capacitor banks.

The gain compensation circuit 202 may include all the elements of the gain compensation circuit 202 in FIG. 4. In one or more embodiments, the capacitor 234 may be implemented as a variable capacitance. In one or more embodiments, the capacitor 234 may include a capacitor bank including a fixed capacitor and a number of capacitors that may be selectively connected in parallel with the fixed capacitor. The number of capacitors may vary based on a desired variation in the capacitance. In one or more embodiments, the capacitor bank may be a six-bit programmable capacitor bank. In one or more embodiments, the capacitor bank of the gain compensation circuit 202 and the capacitor bank of the single-stage inverter-based amplifier (integrator) 140 may be programmed to minimize the process variation, for example, by altering the impact of one or more parameters caused by process variation.

The second resonator 402(2) may include all the elements of the resonator 402(2) in FIG. 4 and may include capacitors 608 and 610. The capacitor 608 may include a first terminal to receive a signal and includes a second terminal coupled to the node 434. The capacitor 610 may include a first terminal to receive a signal and a second terminal coupled to the node 440. The capacitors 436 and 424 are depicted as variable capacitors, each of which may be implemented using a capacitor bank including a fixed capacitor and a number of capacitors that may be selectively connected in parallel with the fixed capacitor. The number of capacitors may vary based on a desired variation in the capacitance. In one or more embodiments, the capacitor banks may be six-bit programmable capacitor banks.

The CTSDM 600 may include a summing element 612 coupled to the nodes 114, 412, 236, 434, and 444 to receive voltage $V_1$, $V_2$, $V_3$, $V_4$, and $V_5$, respectively. The summing element 612 may include an amplifier circuit 616 including an input coupled to a node 615 and an output coupled to a node 620. The summing element 612 may include a first resistor 614(1) coupled between the nodes 444 and 615, a second resistor 614(2) coupled between the nodes 434 and 615, a third resistor 614(3) coupled between the nodes 236 and 615, a further resistor 614(4) coupled between the nodes 412 and 615, and a fifth resistor 614(5) coupled between the nodes 114 and 615. The summing element 612 may include a resistor 618 coupled between the nodes 615 and 620.

The CTSDM 600 may include a quantizer 624 including an input coupled to the node 620, a second input to receive a sample frequency signal $f_s$, and an output. In one or more embodiments, the quantizer 624 may be a successive approximation register (SAR) configured to produce digital codes that may be provided to the shifter 628.

The CTSDM 600 may include a shifter circuit 628 including a first input coupled to the output of the quantizer 624, a second input coupled to a pseudo-random binary sequence (PRBS) 630, and an output coupled to an input of a digital-to-analog converter (DAC) 632, which has an output coupled to the node 102. In one or more embodiments, the shifter circuit 628 may be implemented as a barrel shifter, which may be configured to shift the digital output of the quantizer by a specified number of bits. In one or more embodiments, the shifter circuit 628 may be configured to receive a two-bit digital input from the quantizer 624 and may produce a three-bit digital output, which may be thermometer coded and which may be provided to the input of the DAC 632.

In one or more embodiments, the CTDSM 600 integrates a fifth-order noise transfer function (NTF) that may achieve high linearity and improved SQNR with reduced power consumption. To mitigate the effect of quantizer offset, the quantizer 624 operates while the DAC mismatch is calibrated digitally in the background. In one or more embodiments, the sampling frequency may be approximately 4 GHz.

To further improve the energy efficiency, the first integrator of the CTDSM 600 is implemented using a single-inverter amplifier 140, while its finite gain is compensated further in the signal chain by the gain compensation circuit 202 to restore the noise transfer function.

In one or more embodiments, the gain compensation circuit 202 may provide pole-zero compensation, which may compensate for the finite gain of the single-stage inverter-based amplifier 140 and which may restore the zero of the noise transfer function at DC. To compensate for the process spread of resistor-capacitor (RC) time constants, the capacitors 222, 414, 424, 234, 436, and 446 in the CTDSM 600 are implemented using capacitor banks consisting of a fixed part and a multi-bit programmable part. In one or more embodiments, the multi-bit programmable part may be a six-bit programmable part.

The CTDSM 600 uses a CIFF architecture with the summing amplifier 612 through resistors 614 for high linearity. The output of the CTDSM 600 may be provided to a node 620, which may be coupled to an input of the quantizer 624. The DAC 632 may be implemented as a dual return-to-open DAC to mitigate inter-symbol interference (ISI) errors while the DAC mismatch is randomized and then calibrated digitally using the PRBS 630 and the shifter 628.

Thus, the CTDSM 600 may include a power-efficient single-stage inverter-based amplifier 140 where the same bias current determines both the linearity and thermal noise level. The limited DC gain of the amplifier 140 may limit the quantization noise suppression at DC, but the gain compensation circuit 202 (added after the first resonator 402(1) may restore the noise transfer function. The gain compensation circuit 202 may utilize much lower power as both the thermal noise and distortion added by the gain compensation circuit 202 is suppressed by the gain of preceding stages.

FIG. 7 depicts a flow diagram of a method 700 of modulating a received signal, in accordance with certain embodiments. At 702, the method 700 may include receiving a signal at an input of a continuous-time delta-sigma modulator (CTDSM). In one or more embodiment, the CTDSM may have a selected order. In one particular embodiment, the CTDSM may be a fifth-order CTDSM.

At 704, the method 700 may include integrating the signal using an integrator circuit including a single inverter amplifier to produce an integrated output.

At 706, the method 700 may include shifting noise of the integrated output signal to a relatively higher frequency using a first resonator circuit of the CTDSM to produce a shifted signal. In one or more embodiments, the noise of the scaled output signal may be shifted noise to a second relatively higher frequency using a second resonator circuit of the CTDSM.

At 708, the method 700 may include scaling the shifted signal using a gain compensation circuit of the CTDSM that is configured to compensate a transfer function of the integrator circuit to produce a scaled output signal.

In conjunction with the circuits and methods described above with respect to FIGS. 1-7, a CTDSM is described that may include a single-stage inverter-based amplifier (integrator) 140, one or more resonators 402, and a gain compensation circuit 202 configured to implement a fifth-order noise transfer function having improved performance and reduced power consumption. The disclosure may be further understood in light of the following examples.

Example 1: A modulator circuit may include an integrator circuit including: a first amplifier with limited gain and including an input to receive a signal and including an output to provide an inverted signal; and a capacitor including a first terminal coupled to the input and a second terminal coupled to the output; and may include a gain compensation circuit including: a second inverter amplifier including a gain input coupled to the output of the first amplifier and including a gain output; a first resistor including a first terminal coupled to the gain output and including a second terminal; a second capacitor including a first terminal coupled to the second terminal of the first resistor and including a second terminal coupled to the gain input; and where the integrator circuit has a finite direct current (DC) gain and the gain compensation circuit is configured to compensate for the finite DC gain to provide a selected transfer function from the input of the first amplifier to the gain output.

Example 2: The modulator circuit of Example 1, where the capacitor and the second capacitor are programmable; and a first capacitance of the capacitor and a second capacitance of the second capacitor are configurable to reduce one or more parameters caused by process variation.

Example 3: The modulator circuit of any of Examples 1 or 2, further including a resonator circuit coupled between the output of the first amplifier and the gain input of the gain compensation circuit.

Example 4: The modulator circuit of Example 3, where a signal gain produced by the resonator circuit suppresses noise and distortion of the gain compensation circuit.

Example 5: The modulator circuit of Example 3, where the resonator circuit includes: a second resistor including a first terminal coupled to the output of the first amplifier and including a second terminal; a third inverter amplifier including an input coupled to the second terminal of the second resistor and including an output; a third resistor including a first terminal coupled to the second terminal of the second resistor and a second terminal coupled to the output of the third inverter amplifier; a fourth resistor including a first terminal coupled to the output of the third inverter amplifier and including a second terminal; a fourth inverter amplifier including an input coupled to the second terminal of the fourth resistor and including an output coupled to the gain input; a fifth resistor including a first terminal coupled to the second terminal of the fourth resistor and including a second terminal coupled to the output of the fourth inverter amplifier; and a sixth resistor including a first terminal coupled to the second terminal of the second resistor and including a second terminal coupled to the output of the fourth inverter amplifier.

Example 6: The modulator circuit of any of Examples 1-5, further including: a first resonator circuit coupled between the output of the first amplifier and the gain input of the gain compensation circuit; and a second resonator circuit coupled between the gain output of the gain compensation circuit and a modulator output.

Example 7: The modulator circuit of Example 6, further including one or more input signal taps in one or more of the first amplifier, the first resonator, or the second resonator to reduce peaking.

Example 8: The modulator circuit of Examples 6 or 7, further including a feedback loop coupled between the modulator output and the input of the first amplifier.

Example 9: The modulator circuit of any of Examples 6-8, where the integrator circuit, the first resonator, and second resonator form a fifth order loop filter.

Example 10: The modulator circuit of any of Examples 6-0, where the feedback loop includes: a summing element including: a plurality of resistors, each resistor including a first terminal and a second terminal, the first terminal of each resistor coupled to one of a plurality of nodes, each node associated with one of the first amplifier, the resonator circuit, the gain compensation circuit, or the second resonator circuit, a third inverter amplifier including an input coupled to the second terminal of each of the plurality of resistors and including an output; and a feedback resistor including a first terminal coupled to the input of the third inverter amplifier and an output coupled to the output of the third inverter amplifier; and includes a switch including a first switch terminal coupled to the output of the third inverter amplifier, a switch control terminal, and a second switch terminal; a quantizer including a first input coupled to the second switch terminal, a second input configured to receive a sampling frequency signal, a first output coupled to the switch control terminal, and a second output; a shifter circuit including a shifter input coupled to the second output of the quantizer, a second input to receive a pseudo-random sequence, and a shifter output; and a digital-to-analog converter (DAC) including a DAC input coupled to the shifter output and a DAC output coupled to the input of the first amplifier.

Example 11: The modulator circuit of Example 10, where the quantizer includes a two-bit quantizer.

Example 12: The modulator circuit of any of Examples 10 or 11, where the quantizer includes a successive approximation register.

Example 13: The modulator circuit of any of Examples 10-12, where the quantizer is configured to apply a sample and hold signal to the switch control terminal via the first output of the quantizer to selectively open and close the switch.

Example 15: A method may include receiving a signal at an input of a continuous-time delta-sigma modulator (CTDSM); integrating the signal using an integrator circuit including a first amplifier with limited gain to produce an integrated output; shifting noise of the integrated output signal to a relatively higher frequency using a first resonator circuit of the CTDSM to produce a shifted signal; and scaling the shifted signal using a gain compensation circuit of the CTDSM that is configured to compensate a transfer function of the integrator circuit to produce a scaled output signal.

Example 16: The method of Example 15, further including shifting noise of the scaled output signal to a second relatively higher frequency using a second resonator circuit of the CTDSM.

Example 17: The method of any of Examples 15 or 16, where the CTDSM provides a fifth order loop filter.

Example 18: The method of Example 16, further including: summing voltage values from a plurality of nodes within the CTDSM using a summing element of the CTDSM, the plurality of nodes including a node from one or more of the integrator circuit, the first resonator circuit, the gain compensation circuit, or the second resonator circuit to produce a summing output; shifting the quantizer output based on a pseudo-random binary sequence using a shifter to produce a shifted output; converting the shifted output to a digital signal using a digital-to-analog converter to produce a digital output; and providing the digital output to the integrator circuit.

Example 19: A modulator circuit may include an integrator circuit including: a single inverter amplifier with limited gain including the input to receive a signal and including the output to provide an inverted signal; and a capacitor including a first terminal coupled to the input and a second terminal coupled to the output; and may include a first resonator circuit including a first resonator input coupled to the output of the integrator circuit and a first resonator output; a gain compensation circuit including a gain input coupled to the first resonator output and including a gain output, the gain compensation circuit is configured to compensator for a finite direct current (DC) gain of the integrator circuit to provide a selected transfer function from the input of the single inverter amplifier to the gain output; a second resonator circuit including a second resonator input coupled to the gain output and a second resonator output; a summing element including a summing input coupled to the second resonator output and including a summing output, the summing element configured to add voltage values from each of the integrator circuit, the first resonator circuit, the gain compensation circuit, and the second resonator circuit to produce an output sum at the summing output; a switch including a first switch terminal coupled to the summing output, a switch control terminal, and a second switch terminal; a quantizer including a first quantizer input coupled to the second switch terminal, a second quantizer input configured to receive a sampling frequency signal, a first quantizer output coupled to the switch control terminal, and a second quantizer output; a shifter circuit including a first shifter input coupled to the second quantizer output, a second shifter input to receive a pseudo-random sequence, and a shifter output; and a digital-to-analog converter (DAC) including a DAC input coupled to the shifter output and a DAC output coupled to the input of the single inverter amplifier.

Example 20: The modulator of Example 19, wherein the quantizer is configured to apply a sample and hold signal to the switch control terminal via the first quantizer output to selectively open and close the switch.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims.

What is claimed is:

1. A modulator circuit comprising:
an integrator circuit comprising:
  a first amplifier with limited gain, the first amplifier including an input to receive a signal and including an output to provide an inverted signal; and
  a capacitor including a first terminal coupled to the input and a second terminal coupled to the output;
a gain compensation circuit comprising:
  a second inverter amplifier including a gain input coupled to the output of the first amplifier and including a gain output;
  a first resistor including a first terminal coupled to the gain output and including a second terminal;
  a second capacitor including a first terminal coupled to the second terminal of the first resistor and including a second terminal coupled to the gain input; and
  wherein the integrator circuit has a finite direct current (DC) gain and the gain compensation circuit is configured to compensate for the finite DC gain to provide a selected transfer function from the input of the first amplifier to the gain output.

2. The modulator circuit of claim 1, wherein:
the capacitor and the second capacitor are programmable; and
a first capacitance of the capacitor and a second capacitance of the second capacitor are configurable to reduce one or more parameters caused by process variation.

3. The modulator circuit of claim 1, further comprising a resonator circuit coupled between the output of the first amplifier and the gain input of the gain compensation circuit.

4. The modulator circuit of claim 3, wherein a signal gain produced by the resonator circuit suppresses noise and distortion of the gain compensation circuit.

5. The modulator circuit of claim 3, wherein the resonator circuit comprises:

a second resistor including a first terminal coupled to the output of the first amplifier and including a second terminal;

a third inverter amplifier including an input coupled to the second terminal of the second resistor and including an output;

a third capacitor including a first terminal coupled to the second terminal of the second resistor and a second terminal coupled to the output of the third inverter amplifier;

a fourth resistor including a first terminal coupled to the output of the third inverter amplifier and including a second terminal;

a fourth inverter amplifier including an input coupled to the second terminal of the fourth resistor and including an output coupled to the gain input;

a fourth capacitor including a first terminal coupled to the second terminal of the fourth resistor and including a second terminal coupled to the output of the fourth inverter amplifier; and a fifth resistor including a first terminal coupled to the second terminal of the second resistor and including a second terminal coupled to the output of the fourth inverter amplifier.

6. The modulator circuit of claim 1, further comprising:

a first resonator circuit coupled between the output of the first amplifier and the gain input of the gain compensation circuit; and a second resonator circuit coupled between the gain output of the gain compensation circuit and a modulator output.

7. The modulator circuit of claim 6, further comprising one or more input signal taps in one or more of the first amplifier, the first resonator, or the second resonator to reduce peaking.

8. The modulator circuit of claim 7, further comprising a feedback loop coupled between the modulator output and the input of the first amplifier.

9. The modulator circuit of claim 7, wherein the integrator circuit, the first resonator, and the second resonator form a fifth order loop filter.

10. The modulator circuit of claim 6, wherein the feedback loop comprises:

a summing element comprising:

a plurality of resistors, each resistor including a first terminal and a second terminal, the first terminal of each resistor coupled to one of a plurality of nodes, each node associated with one of the first amplifier, the resonator circuit, the gain compensation circuit, or the second resonator circuit, a third inverter amplifier including an input coupled to the second terminal of each of the plurality of resistors and including an output; and a feedback resistor including a first terminal coupled to the input of the third inverter amplifier and an output coupled to the output of the third inverter amplifier;

a quantizer including a first input coupled to the output of the third inverter amplifier, a second input configured to receive a sampling frequency signal, and an output;

a shifter circuit including a shifter input coupled to the output of the quantizer, a second input to receive a pseudo-random sequence, and a shifter output; and a digital-to-analog converter (DAC) including a DAC input coupled to the shifter output and a DAC output coupled to the input of the first amplifier.

11. The modulator circuit of claim 10, wherein the quantizer comprises a two-bit quantizer.

12. The modulator circuit of claim 10, wherein the quantizer comprises a successive approximation register.

13. The modulator circuit of claim 10, wherein the quantizer comprises a second output coupled to a switch control terminal of a switch coupled between the output of the third amplifier and the first input of the quantizer, the second output is configured to apply a sample and hold signal to the switch control terminal via a second output of the quantizer to selectively open and close the switch.

14. A method comprising:

receiving a signal at an input of a continuous-time delta-sigma modulator (CTDSM);

integrating the signal using an integrator circuit including a first amplifier to produce an integrated output;

shifting noise of the integrated output signal to a relatively higher frequency using a first resonator circuit of the CTDSM to produce a shifted signal; and scaling the shifted signal using a gain compensation circuit of the CTDSM that is configured to compensate a transfer function of the integrator circuit to produce a scaled output signal.

15. The method of claim 14, further comprising shifting noise of the scaled output signal to a second relatively higher frequency using a second resonator circuit of the CTDSM.

16. The method of claim 15, wherein the CTDSM provides a fifth order loop filter.

17. The method of claim 15, further comprising:

summing voltage values from a plurality of nodes within the CTDSM using a summing element of the CTDSM, the plurality of nodes including a node from one or more of the integrator circuit, the first resonator circuit, the gain compensation circuit, or the second resonator circuit to produce a summing output;

selectively controlling a switch asynchronously to provide the summing output to a quantizer of the CTDSM to produce a quantizer output;

shifting the quantizer output based on a pseudo-random binary sequence using a shifter to produce a shifted output;

converting the shifted output to a digital signal using a digital-to-analog converter to produce a digital output; and providing the digital output to the integrator circuit.

18. A modulator circuit comprising:

an integrator circuit comprising:

a first amplifier including the input to receive a signal and including the output to provide an inverted signal; and a capacitor including a first terminal coupled to the input and a second terminal coupled to the output;

a first resonator circuit including a first resonator input coupled to the output of the integrator circuit and a first resonator output;

a gain compensation circuit including a gain input coupled to the first resonator output and including a gain output, the gain compensation circuit is configured to compensator for a finite direct current (DC) gain of the integrator circuit to provide a selected transfer function from the input of the first amplifier to the gain output;

a second resonator circuit including a second resonator input coupled to the gain output and a second resonator output;

a summing element including a summing input coupled to the second resonator output and including a summing output, the summing element configured to add voltage values from each of the integrator circuit, the first resonator circuit, the gain compensation circuit, and the second resonator circuit to produce an output sum at the summing output;

a switch including a first switch terminal coupled to the summing output, a switch control terminal, and a second switch terminal;

a quantizer including a first quantizer input coupled to the second switch terminal, a second quantizer input configured to receive a sampling frequency signal, a first quantizer output coupled to the switch control terminal, and a second quantizer output;

a shifter circuit including a first shifter input coupled to the second quantizer output, a second shifter input to receive a pseudo-random sequence, and a shifter output; and a digital-to-analog converter (DAC) including a DAC input coupled to the shifter output and a DAC output coupled to the input of the first amplifier.

19. The modulator of claim 18, wherein the quantizer is configured to apply a sample and hold signal to the switch control terminal via the first quantizer output to selectively open and close the switch.

* * * * *